United States Patent
Sinclair et al.

(10) Patent No.: US 11,387,073 B2
(45) Date of Patent: Jul. 12, 2022

(54) IN SITU ANGLE MEASUREMENT USING CHANNELING

(71) Applicant: Applied Materials, Inc., Santa Clara, CA (US)

(72) Inventors: Frank Sinclair, Boston, MA (US); Jonathan Gerald England, West Sussex (GB); Joseph C. Olson, Beverly, MA (US)

(73) Assignee: Applied Materials, Inc., Santa Clara, CA (US)

(*) Notice: Subject to any disclaimer, the term of this patent is extended or adjusted under 35 U.S.C. 154(b) by 213 days.

(21) Appl. No.: 16/828,218

(22) Filed: Mar. 24, 2020

(65) Prior Publication Data

US 2021/0305011 A1    Sep. 30, 2021

(51) Int. Cl.
*H01J 37/244* (2006.01)
*H01J 37/20* (2006.01)
(Continued)

(52) U.S. Cl.
CPC .......... *H01J 37/244* (2013.01); *H01J 37/141* (2013.01); *H01J 37/20* (2013.01); *H01J 37/317* (2013.01); *H01J 37/3171* (2013.01); *H01J 2237/1507* (2013.01); *H01J 2237/20207* (2013.01); *H01J 2237/20214* (2013.01);
(Continued)

(58) Field of Classification Search
CPC ...... H01J 37/244; H01J 37/3171; H01J 37/20; H01J 37/141; H01J 37/317; H01J 2237/2445; H01J 2237/20214; H01J 2237/24475; H01J 2237/24578; H01J 2237/1507; H01J 2237/24528; H01J 2237/31706; H01J 2237/20207;
(Continued)

(56) References Cited

U.S. PATENT DOCUMENTS

| | | | |
|---|---|---|---|
| 6,555,832 B1 * | 4/2003 | Ryding | ............... H01J 37/3171 250/397 |
| 6,573,518 B1 | 6/2003 | Renau et al. | |

(Continued)

FOREIGN PATENT DOCUMENTS

| | | |
|---|---|---|
| JP | 2013-65578 A | 4/2013 |
| TW | 200412616 A | 7/2004 |

(Continued)

OTHER PUBLICATIONS

International Search Report and Written Opinion dated Jun. 24, 2021 in corresponding PCT application No. PCT/US2021/021050.

*Primary Examiner* — Kiet T Nguyen
(74) *Attorney, Agent, or Firm* — Nields, Lemack & Frame, LLC

(57) ABSTRACT

A system and method that is capable of measuring the incident angle of an ion beam, especially an ion beam comprising heavier ions, is disclosed. In one embodiment, X-rays, rather than ions, are used to determine the channeling direction. In another embodiment, the workpiece is constructed, at least in part, of a material having a high molecular weight such that heaver ion beams can be measured. Further, in another embodiment, the parameters of the ion beam are measured across an entirety of the beam, allowing components of the ion implantation system to be further tuned to create a more uniform beam.

18 Claims, 4 Drawing Sheets

(51) Int. Cl.
*H01J 37/317* (2006.01)
*H01J 37/141* (2006.01)

(52) U.S. Cl.
CPC ............ *H01J 2237/20228* (2013.01); *H01J 2237/2445* (2013.01); *H01J 2237/24475* (2013.01); *H01J 2237/24528* (2013.01); *H01J 2237/24578* (2013.01); *H01J 2237/31706* (2013.01)

(58) Field of Classification Search
CPC ..... H01J 2237/20228; H01J 2237/2446; H01J 2237/24405
USPC ................................................... 250/492.21
See application file for complete search history.

(56) References Cited

U.S. PATENT DOCUMENTS

| | | | |
|---|---|---|---|
| 2006/0208204 A1* | 9/2006 | Gupta | ............... H01L 21/26586 |
| | | | 250/492.21 |
| 2008/0096359 A1* | 4/2008 | Gupta | ..................... H01L 22/14 |
| | | | 438/302 |
| 2010/0003770 A1 | 1/2010 | Shibata et al. | |
| 2015/0300965 A1 | 10/2015 | Sezginer et al. | |
| 2016/0013014 A1 | 1/2016 | Kagawa et al. | |
| 2016/0111307 A1 | 4/2016 | Davis | |
| 2016/0190346 A1 | 6/2016 | Kawata et al. | |
| 2016/0223476 A1 | 8/2016 | Quintanilha | |
| 2017/0271161 A1* | 9/2017 | Kawasaki | ............... H01L 29/36 |

FOREIGN PATENT DOCUMENTS

| | | |
|---|---|---|
| TW | 201543003 A | 11/2015 |
| TW | 201629431 A | 8/2016 |
| TW | 201630099 A | 8/2016 |
| TW | 201633410 A | 9/2016 |
| WO | 01/27968 A1 | 4/2001 |

* cited by examiner

IN SITU ANGLE MEASUREMENT USING CHANNELING

FIELD

Embodiments of the present disclosure relate to systems and methods for determining an incident angle of an ion beam, and more particularly, determining the incident angle using channeling.

BACKGROUND

Ion beams are used to implant dopants into workpieces, such as silicon substrates. These ion beams may be created using an ion source that generates ions of a desired species. These ions are extracted and manipulated by a plurality of components that selects the desired species, and guide the ions toward the workpiece.

The resulting ion beam strikes the workpiece at one or more incident angles, depending on the geometry of the ion beam. In certain embodiments, it may be advantageous to precisely measure the incident angle of the ions on the workpiece. For example, in certain embodiments, there are implant processes where the incident angle needs to be tightly controlled.

One method of determining the angle distribution of an ion beam is through the use of Rutherford Backscattering. As ions strike the workpiece, some are scattered. The amount of ions that are scattered decreases as the ions become aligned with the channels in the crystalline structure of the workpiece. For example, if the incident angle of the ions is exactly parallel with the channels of the workpiece, the backscattering will be minimized.

However, Rutherford Backscattering is limited to embodiments where the molecular weight of the ions being implanted is less than the molecular weight of the workpiece. Thus, Rutherford Backscattering cannot be performed for a phosphorus or arsenic ion beams and a silicon workpiece.

Therefore, it would be beneficial if there were a system and method of accurately measuring the incident angle of an ion beam. Furthermore, it would be advantageous if beams that comprise heavier ions, such as arsenic and phosphorus, can be measured. Finally, it would be beneficial if this system and method could also be used to improve the accuracy with which the angle distribution of the ion beam meets the process demands.

SUMMARY

A system and method that is capable of measuring the incident angle of an ion beam, especially an ion beam comprising heavier ions, is disclosed. In one embodiment, X-rays, rather than backscattered ions, are used to determine the channeling direction. In another embodiment, the workpiece is constructed, at least in part, of a material having a high molecular weight such that heavier ion beams can be measured. Further, in another embodiment, the parameters of the ion beam are measured across an entirety of the beam, allowing components of the ion implantation system to be further tuned to create a more uniform beam.

According to one embodiment, an incident angle measurement system is disclosed. The incident angle measurement system comprises an ion implantation system, generating an ion beam; a movable workpiece holder to hold a workpiece; a detector to capture emissions from the workpiece, wherein the detector comprises a plurality of sensors disposed along a width of the ion beam, referred to as an X direction; and a controller, wherein the controller rotates the movable workpiece holder to vary an X angle and receives an output from the detector at each of a plurality of X angles, and wherein an incident angle of the ion beam in the X direction at each of a plurality of locations along the X direction is determined to be at the X angle where the output received from a respective sensor is a minimum. In one embodiment, the plurality of sensors comprises Faraday sensors, wherein each Faraday sensors captures backscattered ions from a portion of the ion beam. In certain embodiments, the plurality of sensors comprises X-ray detectors, wherein each X-ray detector captures X-rays emitted from a portion of the workpiece. In certain embodiments, the controller calculates a spread of incident angles in the X direction from outputs received from the plurality of sensors. In some embodiments, the ion implantation system comprises extraction optics disposed proximate an ion source, wherein the controller adjusts a position of the extraction optics to correct the spread of incident angles. In certain embodiments, the ion implantation system comprises a quadrupole lens disposed downstream from an ion source, wherein the controller adjusts a focusing effect of the quadrupole lens to correct the spread of incident angles. In certain embodiments, the ion implantation system comprises a collimator disposed downstream from an ion source, wherein the controller adjusts a current supplied to the collimator to correct the spread of incident angles. In certain embodiments, the controller rotates the movable workpiece holder to vary a Y angle and receives an output from the detector at each of a plurality of Y angles, and wherein an incident angle of the ion beam in a Y direction at each of a plurality of locations along the X direction is determined to be at the Y angle where the output received from a respective sensor is a minimum. In certain embodiments, the controller calculates a spread of incident angles in the Y direction from outputs received from the plurality of sensors.

According to another embodiment, an incident angle measurement system is disclosed. The incident angle measurement system comprises an ion implantation system, generating an ion beam; a movable workpiece holder to hold a workpiece; a detector, wherein the detector comprises one or more X-ray detectors; and a controller, wherein the controller rotates the movable workpiece holder to vary an X angle and receives an output from the detector at each of a plurality of X angles, and wherein an incident angle of the ion beam is determined to be at the X angle where the output from the detector is a minimum. In certain embodiments, the ion beam comprises ions having a higher atomic mass than the workpiece. In certain embodiments, the ion beam comprises phosphorus or arsenic ions and the workpiece comprises a silicon workpiece.

According to another embodiment, an incident angle measurement system is disclosed. The incident angle measurement system comprises an ion implantation system, generating an ion beam; a movable workpiece holder to hold a workpiece; a detector; a single crystal target material, different from the workpiece, disposed on the movable workpiece holder; and a controller, wherein the controller rotates the movable workpiece holder to vary an X angle and receives an output from the detector at each of a plurality of X angles, and wherein an incident angle of the ion beam is determined to be at the X angle where the output from the detector is a minimum. In certain embodiments, the single crystal target material is disposed on the movable workpiece holder at a location beyond an edge of the workpiece, such that the single crystal target material may be implanted by the ion beam when the workpiece is disposed on the movable workpiece holder. In certain embodiments, the single crystal target material comprises an element having a higher atomic mass than the workpiece. In some embodiments, the single crystal target material is selected from the group consisting of tungsten, molybdenum, tantalum, germanium, gallium arsenide, gallium nitride and indium phosphide. In certain embodiments, the controller rotates the movable workpiece holder to vary a Y angle and wherein an incident angle of the ion beam is determined to be at the Y angle where the output from the detector is a minimum. In certain embodiments, the single crystal target material is disposed on the movable workpiece holder in place of the workpiece. In some embodiments, the single crystal target material has a shape and size of the workpiece.

BRIEF DESCRIPTION OF THE FIGURES

For a better understanding of the present disclosure, reference is made to the accompanying drawings, which are incorporated herein by reference and in which.

DETAILED DESCRIPTION

As noted above, the present system may be used to perform channeling implants or to measure and tune an ion beam in an ion implantation system. In certain embodiments, the ion beam may be a scanned ribbon beam, which is created using a spot beam ion implantation system.

Figure 1:
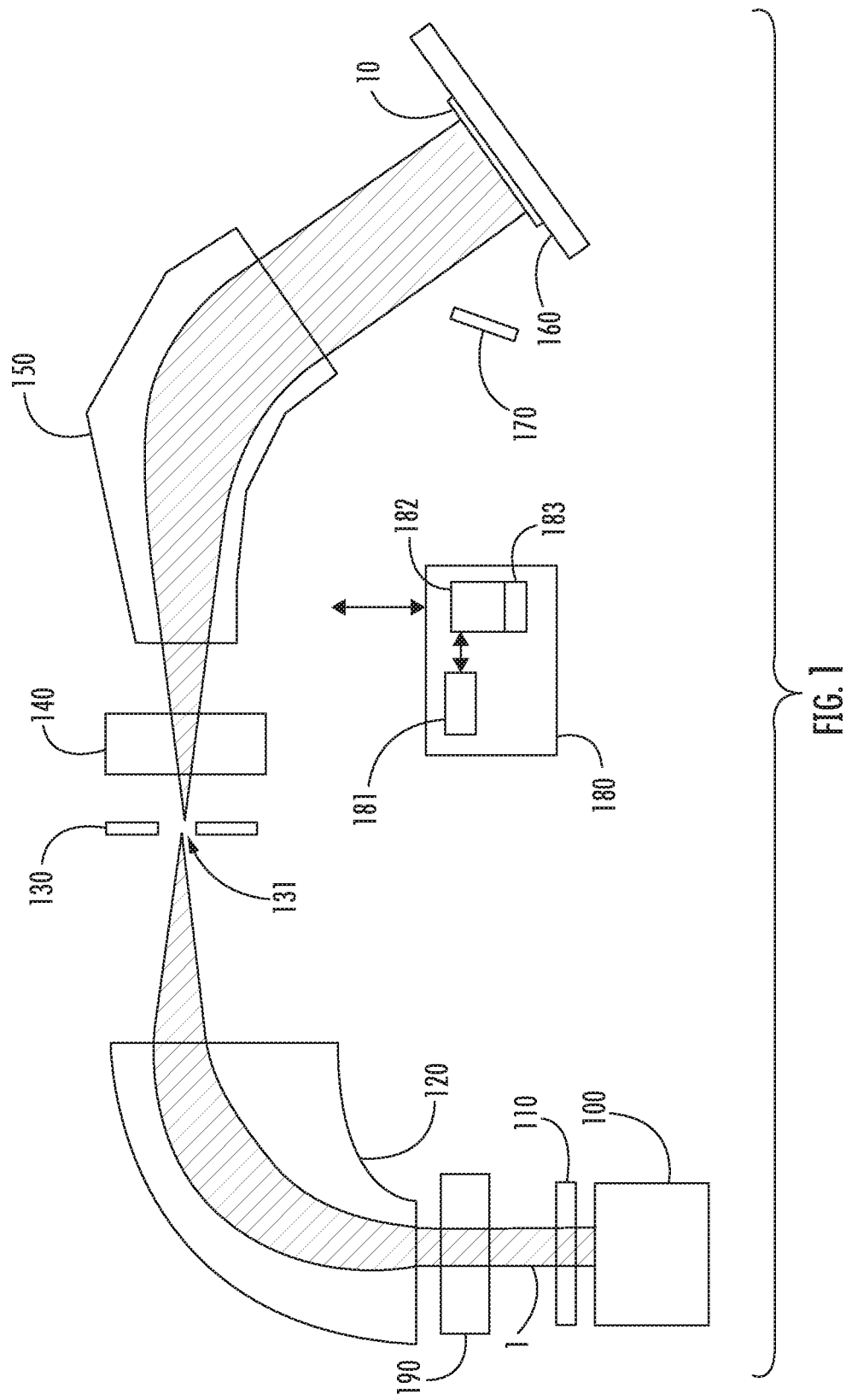
FIG. 1 is an ion implantation system in accordance with one embodiment.

As shown in FIG. 1, the ion implantation system includes an ion source 100 comprising a plurality of chamber walls defining an ion source chamber in which a plasma is created. In certain embodiments, the ion source 100 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 1 generated in the ion source chamber are extracted and directed through a mass analyzer 120 and toward a workpiece 10. The extraction aperture may be any suitable shape. In certain embodiments, the extraction aperture may be oval or rectangular shaped, having one dimension, referred to as the width (x-dimension), which may be much larger than the second dimension, referred to as the height (y-dimension).

Disposed outside and proximate the extraction aperture of the ion source 100 are extraction optics 110. In certain embodiments, the extraction optics 110 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source so as to attract ions through the extraction aperture. The extraction aperture and the aperture in the extraction optics 110 are aligned such that the ions 1 pass through both apertures.

Located downstream from the extraction optics 110 is a mass analyzer 120. The mass analyzer 120 uses magnetic fields to guide the path of the extracted ion beam 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system.

In certain embodiments, the ions that pass through the mass resolving device 130 may form a spot beam.

The spot beam may then enter a scanner 140 which is disposed downstream from the mass resolving device 130. The scanner 140 causes the spot beam to be fanned out into a plurality of divergent beamlets. The scanner 140 may be electrostatic or magnetic.

In other embodiments, the ions that pass through the mass resolving device 130 may form a ribbon ion beam, where a wide beam is transported throughout the ion implantation system. For example, a ribbon beam may be extracted from the ion source 100. In this embodiment, the scanner 140 is not needed.

In certain embodiments, a collimator 150 then converts these divergent beamlets into a plurality of parallel beamlets that are directed toward the workpiece 10. The collimator 150 may be a magnet. In this embodiment, current is applied to the collimator magnet to manipulate the beamlets that pass therethrough.

In other embodiments, a system of electrostatic lenses can act as a collimator 150 and turn a divergent beam into a plurality of parallel beamlets.

The workpiece 10 is disposed on a movable workpiece holder 160 downstream from the collimator 150.

In certain embodiments, one or more quadrupole lenses 190 may be disposed along the path of the ions. For example, a quadrupole lens 190 may be disposed before the mass analyzer 120, after the mass analyzer 120, after the mass resolving device 130, or in other locations.

In certain embodiments, the direction of the ion beam is referred to as the Z-direction, the direction perpendicular to this direction and horizontal may be referred to as the X-direction, while the direction perpendicular to the Z-direction and vertical may be referred to as the Y-direction. In this example, it is assumed that the scanner 140 scans the spot beam in the X-direction while the movable workpiece holder 160 is translated in the Y-direction.

A detector 170 may be disposed proximate the region of the workpiece 10. The detector 170 may be used to measure certain parameters associated with the ion beam 1. In certain embodiments, the detector 170 may comprise one or more Faraday devices arranged in a linear manner. In another embodiment, the detector 170 may comprise a plurality of X-ray detectors. The operation of the detector 170 is described in more detail below.

A controller 180 is also used to control the system. The controller 180 has a processing unit 181 and an associated memory device 182. This memory device 182 contains the instructions 183, which, when executed by the processing unit, enable the system to perform the functions described herein. This memory device 182 may be any non-transitory storage medium, including a non-volatile memory, such as a FLASH ROM, an electrically erasable ROM or other suitable devices. In other embodiments, the memory device 182 may be a volatile memory, such as a RAM or DRAM. In certain embodiments, the controller 180 may be a general purpose computer, an embedded processor, or a specially designed microcontroller. The actual implementation of the controller 180 is not limited by this disclosure.

The controller 180 may be in communication with the detector 170, the scanner 140 and the movable workpiece holder 160 as described in more detail below. The controller 180, the detector 170, and the movable workpiece holder 160 may be part of an incident angle measurement system.

Figure 2:
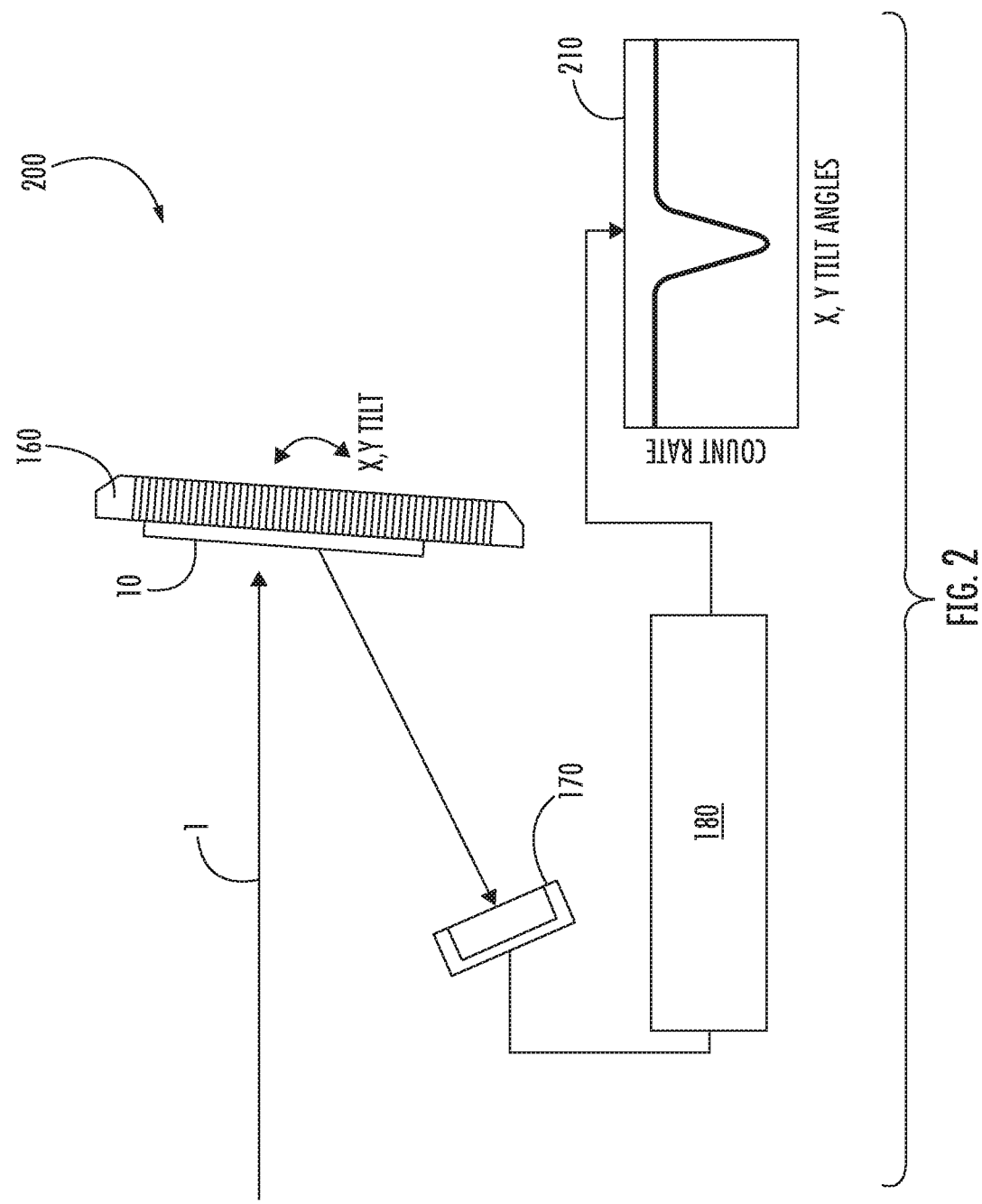
FIG. 2 is the incident angle measurement system according to one embodiment.

FIG. 2 shows a simplified illustration showing the operation of the incident angle measurement system 200. As stated above, the controller 180 is in communication with the movable workpiece holder 160 and the detector 170. An ion beam 1 is directed toward a workpiece 10, which is mounted on movable workpiece holder 160. The detector 170 is disposed proximate the workpiece 10 so as to receive emissions from the workpiece 10 as it is being implanted by the ion beam 1. For example, the emissions may be backscattered ions or X-Rays. The controller 180 rotates the movable workpiece holder 160 about either the Y axis or the X axis. At each rotational angle, the detector 170 detects the emissions and transmits this information to the controller 180. The controller 180 may record this information as a function of rotational angle. After this process has been completed, the result may be a set of data that shows a minimum value, such as is shown in graph 210. Note that the controller 180 does not have to produce a graph 210, rather the graph 210 is shown to illustrate the expected output from the detector 170 as the movable workpiece holder 160 is rotated.

If the controller 180 repeats this process by rotating about both the X-axis and the Y-axis, the X angle (X') and the Y angle (Y') that correspond to the orientation of the movable workpiece holder 160 that causes the beam to channel into the workpiece 10 can be determined with high precision. Rotation about the X-axis results in changing Y angles, while rotation about the Y-axis results in changing X angles.

Further, the system may also include the ability to alter the beam angles based on the results of the incident angle measurement system 200. For example, based on the results attained, the controller 180 may manipulate the current to the collimator 150 or another component in the ion implantation system. Thus, in certain embodiments, an incident angle measurement and control system is disclosed.

If, for example, the ion beam at the workpiece is found to be diverging in the X direction, this can be compensated for by increasing the current to the collimating magnet. Such an increase in current will do two things: it will increase the average bend angle and increase the amount of convergence. Once the right current to achieve perfect parallelism (neither diverging nor converging) has been achieved and the average angle measured, the workpiece 10 can be rotated into the desired orientation to the ion beam and, because the ion beam is now parallel, the desired beam incident angle will be precisely the same across the width of the flat workpiece.

In another example, if the beam at the workpiece is found to have an upward direction at one side and a less upward direction at the other side, it may be possible to move the ion beam vertically by adjusting the position of an electrode in the extraction optics 110, thus directing the ion beam 1 closer to the midplane of the collimating magnet and achieving a more uniform vertical (y') angle across the sweep (x). Once a uniform angle has been achieved, the workpiece may be tilted to the desired orientation with respect to this uniform angle.

This system may also detect angle variations that are not possible to correct by manipulating the beam, but may need manual maintenance intervention such as alignment or replacement of parts.

The present disclosure describes a plurality of embodiments that allow improved measurement and optional control of the incident angle of ion beams.

In the first embodiment, Rutherford Backscattering is used to determine the incident angle of an ion beam in a plurality of locations. FIG. 3A shows a side view of the movable workpiece holder 160, while FIG. 3B shows a top view of the movable workpiece holder 160. A workpiece 10 is disposed on the movable workpiece holder 160. In certain embodiments, the workpiece 10 may be a silicon substrate. In this embodiment, the detector 170 comprises one or more Faraday sensors 171 that are spaced apart in the X direction. In some embodiments, one or more Faraday sensors 171 may also be spaced apart in the Y direction. In the case of a spot beam, as the ion beam 1 is scanned in the X direction (i.e. vertically in FIG. 3B), each of the Faraday sensors 171 receives emissions from the workpiece 10 sequentially. In the case of a ribbon ion beam, all of the Faraday sensors 171 receive emissions simultaneously. The controller 180 is in communication with each of these Faraday sensors 171 and is able to create a graph, similar to graph 210 for each of the Faraday sensors 171. After all of the data has been collected from the Faraday sensors 171, the controller 180 may rotate the movable workpiece holder 160 about the X-axis and/or the Y-axis. In this way, the controller 180 may determine the incident angle (i.e. the X angle (X') and/or the Y angle (Y')) for a plurality of positions along the length of the ion beam 1.

As noted above, the implantation system creates a wide beam, either as a ribbon beam or a scanned spot beam. For many beam tuning issues, it is beneficial to validate that the angles (i.e. X' and Y') are uniform across the width of the beam. If there is an overall divergence or convergence (in the sense that $$X'(x) = \frac{\int J(x,y) \cdot \langle x' \rangle(x,y) dy}{\int J(x,y) dy} \text{ or } Y'(x) = \frac{\int J(x,y) \cdot \langle y' \rangle(x,y) dy}{\int J(x,y) dy}$$

shows an overall upward or downward slope), this can be corrected by adjusting the current to the collimator 150.

As described above, the X angle along the ion beam 1 (i.e. X'(x)) can be determined by using a plurality of detectors 170, each directed at a limited range of x across the width of the ion beam 1. As described above, the X tilt angle can be varied and the minimum of each of the plurality of Faraday sensors 171 can be identified. In this way, it is possible to obtain a plurality of points on the X'(x) curve and correct for any convergence or divergence in the X direction. Similarly, the Y tilt angle can be varied and the minimum of each of the plurality of Faraday sensors 171 can be identified. In this way, it is possible to obtain a plurality of points on the Y'(x) curve and detect a vertical shear distortion of the beam.

Further, if there is fixed offset in the X angle or the Y angle, the movable workpiece holder 160 may be tilted to ensure that the ion beam 1 strikes the workpiece 10 at a perpendicular angle. In other words, rather than tuning the ion beam 1 to remove any constant angular offset, the movable workpiece holder 160 may be adjusted to compensate for this offset.

Further, this embodiment may also be able to measure the spread of angles in both x and y directions as a function of x: $\sigma_x(x)$ and $\sigma_y(x)$. In order to achieve the maximum amount of channeling, it may be advantageous to minimize these angle spreads. The magnitude of the angle spreads is typically set by the details of the beam optics and can be manipulated by such variables as the precise position of the extraction electrode, or the focusing effects of various quadrupole lenses 190 that may be included in the beamline for this purpose. Often a spot beam is tuned for minimum size at the workpiece 10, as this gives the most efficient dosing. However, tuning for minimum angle spread may produce a larger spot size and less efficient scanning but more effective channeling and thus superior process results.

Thus, in one embodiment, an incident angular measurement and control system that captures incident angle information for a plurality of positions along the width of an ion beam is disclosed. This is accomplished using a plurality of detectors 170 that are spaced apart in the X direction. In yet another embodiment, a single detector 170 may be utilized. In this case, the detector 170 is moved to different positions in the X direction to gather data across the width of the ion beam.

In another embodiment, the present application allows the use of ion beams comprising heavier species with Rutherford Backscattering. In one embodiment, a target workpiece made of a heavier crystalline material, such as tungsten, can be employed. Specifically, as noted above, the use of a silicon substrate limits the possible species for the ion beam to those having an atomic weight less than silicon. Thus, a different single crystal material, such as tungsten or some other higher atomic number metal or compound, may be used as the target workpiece. This target workpiece could be in the shape of the silicon wafer, and may be clamped by the electrostatic clamp to the movable workpiece holder 160. In this embodiment, the measurements would be taken in the same manner as described above.

Figure 4:
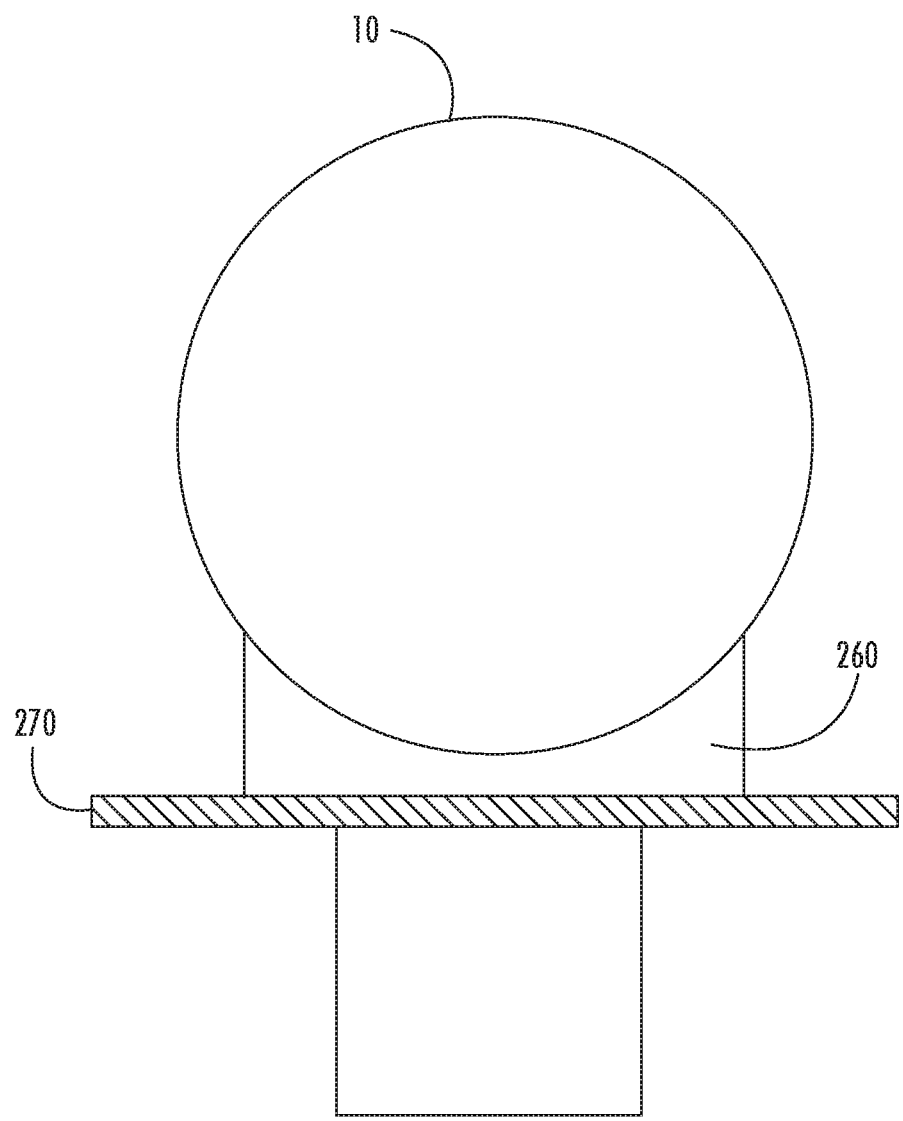
FIG. 4 shows a single crystal target material mounted to a movable workpiece holder.

In another embodiment, a target material may be added to the movable workpiece holder. In certain embodiments, the target material may be disposed on the movable workpiece holder 160 at a position beyond the edge of the workpiece 10. One possible geometry is shown in FIG. 4. This figure shows a movable workpiece holder 260, wherein a strip of single crystal target material 270 is attached below the silicon workpiece 10, but mounted to the movable workpiece holder 260 in such a way that it is articulated by the tilt mechanism that controls the workpiece 10. This single crystal target material 270 may be affixed to the movable workpiece holder 260 in such a way that the relationship between the channeling direction of the single crystal target material 270 and the position of the movable workpiece holder 260 is well defined. This single crystal target material 270 may be at least as wide as the workpiece 10, such that it is able to provide data across an entirety of the width of the ion beam 1. Thus, the width of the single crystal target material 270 may be greater than a width of the workpiece 10. The height of the single crystal target may be similar to or larger than the height of the ion beam, which can vary from about 5 mm to 50 mm. The thickness of the single crystal target may be at least thick enough to stop the ion beam 1. Typical ranges for high energy ions are in the range from 1 to 20 microns.

A high atomic mass crystal target is advantageous for Rutherford Backscattering measurements as ions with an atomic mass higher than silicon will be back scattered. Using a metal as the target has the advantage that crystal damage accumulates much more slowly in the target than for covalently bonded structures. Further, using an aluminum target and detecting the X-rays instead of the backscattered ions would have the advantage over tungsten in that it would avoid the risk of deleterious contamination of most semiconductors.

Thus, in this embodiment, the system utilizes a target material that is a single crystal material having a higher atomic mass than silicon, such as tungsten, molybdenum, tantalum, germanium, gallium arsenide, gallium nitride, indium phosphide or any other material that can be procured as a single crystal or deposited epitaxially on some other single crystal substrate. This single crystal target material 270 may be used to measure the incident angle at a particular location, such as the middle of the ion beam. In another embodiment, this single crystal target material 270 may be utilized with the detector 170 of FIGS. 3A-B, such that the incident angle is measured at a plurality of locations along the width of the ion beam.

The single crystal target material 270 may be disposed in other locations on the movable workpiece holder 260. For example, in one embodiment, the single crystal target material 270 is disposed in the location where the workpiece 10 is typically positioned. In one embodiment, the single crystal target material 270 may be the same size and shape as a typical workpiece. In another embodiment, the single crystal target material 270 may have a different shape and size, but may be dimensioned so that it has a width that is at least as wide as the workpiece and a height that is at least as tall of the ion beam 1.

According to another embodiment, the detector 170 does not employ Rutherford Backscattering. Rather, the detector 170 comprises one or more X-ray detectors. Using an X-ray detector instead of a Faraday sensor avoids the limitation on the relative mass of the ions and the target.

The Particle Induced Xray Emission (PIXE) process occurs when a high energy ion strikes a molecule and excites the inner shell electrons. When the electrons fall back into their ground state, the electrons emit X-rays whose wavelength is determined by their binding energy and is thus characteristic of the material in the target workpiece. When a high energy ion channels in a crystal, this interaction with the tightly bound electrons is greatly reduced. Since it is these inner shell electrons that produce the highest energy (K line) X-rays, the X-ray yield may be very sensitive to the channeling condition. In other words, the amount of X-rays produced decreases when the ion beam 1 enters a channel in the workpiece.

In other words, like Rutherford Backscattering, the emissions of X-rays are at a minimum when the ions are implanted into the channels of the crystalline structure. Thus, in certain embodiments, the detector 170 may comprise one or more X-ray detectors. Recent developments in X-ray detectors have resulted in compact units with no need for liquid nitrogen and having energy resolution that is sufficient to eliminate background from other sources.

Of interest is that the X-ray emission occurs regardless of the relative mass of the ions and the workpiece. In other words, an ion beam comprising a heavier ion, such as phosphorus or arsenic, may implant a silicon workpiece and still generate X-rays. Thus, the use of PIXE allows a silicon workpiece to be used regarding of the species being implanted.

It is noted that X-rays detectors may be used as the detector 170 in any of the embodiments disclosed herein. In other words, X-ray detectors may be used in the embodiment of FIG. 3. Further, if desired, X-ray detectors may be used with a heavier target or lighter target.

The embodiments described above in the present application may have many advantages. High energy implants benefit from using deliberately channeled incident angles for at least two reasons. First, the ions penetrate deeper into the workpiece for a given energy. Secondly, channeled incident angles create less crystal damage.

However, deliberately channeled implants utilize extremely accurate angle control (<0.05° or approximately 1 mrad), for both the average beam angle and for the spread of angles within the ion beam. Existing metrology based on high aspect ratio apertures and faradays to measure ion currents are not capable of this accuracy. Further, current systems are also limited due to the constraint regarding the relative mass of the ion and the silicon workpiece in Rutherford Backscattering applications.

Figure 3:
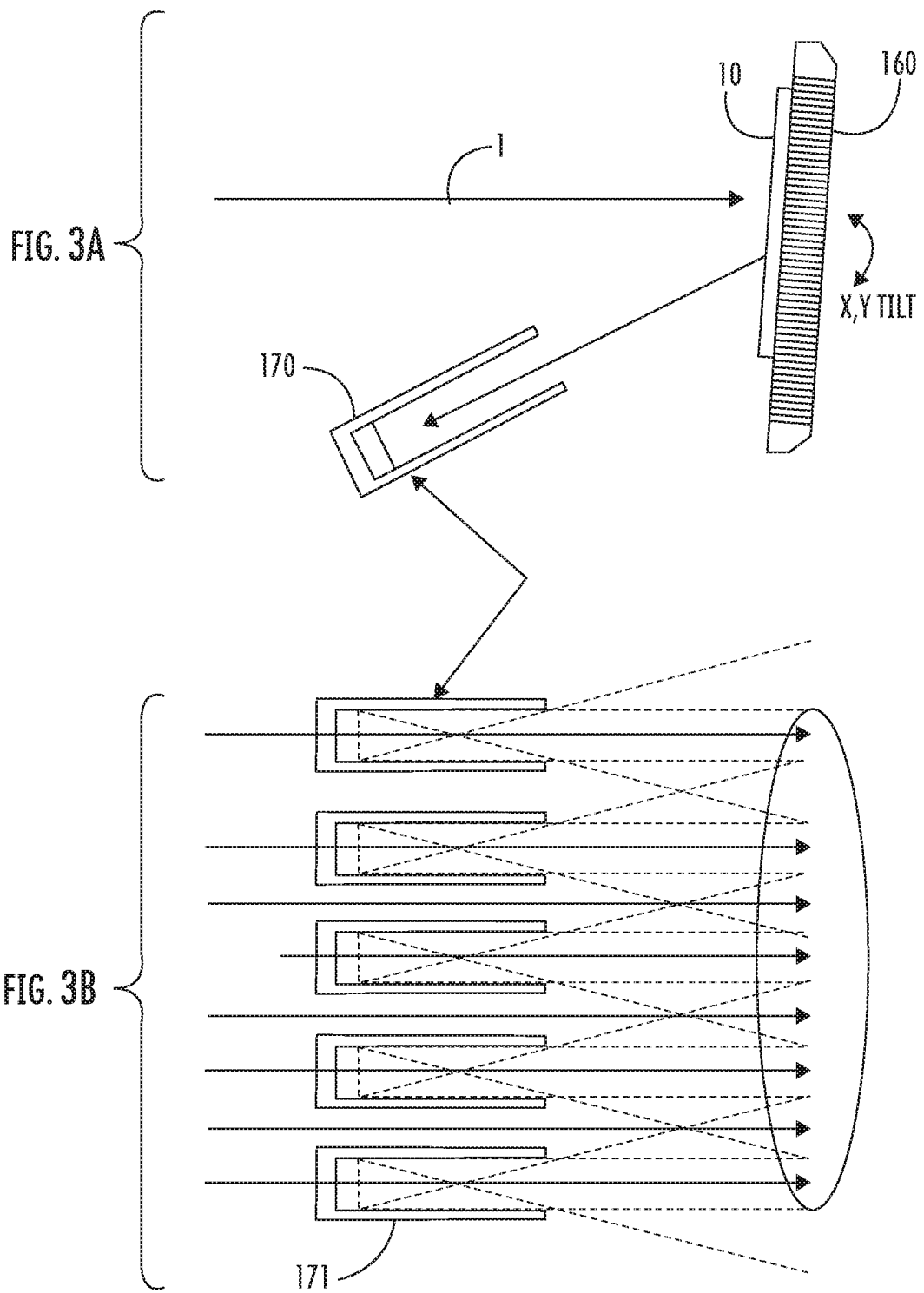
FIG. 3A is a side view of the incident angle measurement system according to another embodiment.
FIG. 3B is a top view of the incident angle measurement system of FIG. 3A.

By using a plurality of detectors in the X direction, as shown in FIG. 3, it is possible to determine and control the beam angle and angle spread across an entire ion beam. Specifically, the current to the collimator 150 may be adjusted to meet the limitations of channeled implants. Alternatively or additionally, the precise positioning of the extraction optics and the focusing effects of the quadrupole lenses may be adjusted to meet these limitations. Thus, the present system makes it possible to perform channeled implants across an entire workpiece.

Further, the use of X-ray detectors allows the same measurement and control system to be used regardless of the desired ion species. Thus, the measurement can be made using heavier ions and a silicon workpiece, if desired.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An incident angle measurement system comprising:
an ion implantation system, generating an ion beam;
a movable workpiece holder to hold a workpiece;
a detector to capture emissions from the workpiece, wherein the detector comprises a plurality of sensors disposed along a width of the ion beam in an X direction; and
a controller, wherein the controller rotates the movable workpiece holder to vary an X angle and receives an output from the detector at each of a plurality of X angles, and wherein an incident angle of the ion beam in the X direction at each of a plurality of locations along the X direction is determined to be at the X angle where the output received from a respective sensor is a minimum.

2. The incident angle measurement system of claim 1, wherein the plurality of sensors comprises Faraday sensors, wherein each of the Faraday sensors captures backscattered ions emitted from a portion of the workpiece.

3. The incident angle measurement system of claim 1, wherein the plurality of sensors comprises X-ray detectors, wherein each X-ray detector captures X-rays emitted from a portion of the workpiece.

4. The incident angle measurement system of claim 1, wherein the controller calculates a spread of incident angles in the X direction from outputs received from the plurality of sensors.

5. The incident angle measurement system of claim 4, wherein the ion implantation system comprises extraction optics disposed proximate an ion source, wherein the controller adjusts a position of the extraction optics to correct the spread of incident angles.

6. The incident angle measurement system of claim 4, wherein the ion implantation system comprises a quadrupole lens disposed downstream from an ion source, wherein the controller adjusts a focusing effect of the quadrupole lens to correct the spread of incident angles.

7. The incident angle measurement system of claim 4, wherein the ion implantation system comprises a collimator disposed downstream from an ion source, wherein the controller adjusts a current supplied to the collimator to correct the spread of incident angles.

8. The incident angle measurement system of claim 1, wherein the controller rotates the movable workpiece holder to vary a Y angle and receives an output from the detector at each of a plurality of Y angles, and wherein an incident angle of the ion beam in a Y direction at each of a plurality of locations along the X direction is determined to be at the Y angle where the output received from a respective sensor is a minimum.

9. The incident angle measurement system of claim 8, wherein the controller calculates a spread of incident angles in the Y direction from outputs received from the plurality of sensors.

10. An incident angle measurement system comprising:
an ion implantation system, generating an ion beam;
a movable workpiece holder to hold a workpiece;
a detector, wherein the detector comprises one or more X-ray detectors; and a controller, wherein the controller rotates the movable workpiece holder to vary an X angle and receives an output from the detector at each of a plurality of X angles, wherein the output from the detector is indicative of an amount of X-rays emitted by the workpiece and received by the detector, and wherein an incident angle of the ion beam is determined to be at the X angle where the output from the detector is a minimum.

11. The incident angle measurement system of claim 10, wherein the ion beam comprises ions having a higher atomic mass than that of the workpiece.

12. The incident angle measurement system of claim 11, wherein the ion beam comprises phosphorus or arsenic ions and the workpiece comprises a silicon workpiece.

13. An incident angle measurement system comprising:
an ion implantation system, generating an ion beam;
a movable workpiece holder to hold a workpiece;
a detector;
a single crystal target material, different from the workpiece, disposed on the movable workpiece holder at a location beyond an edge of the workpiece, such that the single crystal target material may be implanted by the ion beam when the workpiece is disposed on the movable workpiece holder; and
a controller, wherein the controller rotates the movable workpiece holder to vary an X angle and receives an output from the detector at each of a plurality of X angles, and wherein an incident angle of the ion beam is determined to be at the X angle where the output from the detector is a minimum.

14. The incident angle measurement system of claim 13, where the single crystal target material comprises an element having a higher atomic mass than that of the workpiece.

15. The incident angle measurement system of claim 13, wherein the single crystal target material is selected from the group consisting of tungsten, molybdenum, tantalum, germanium, gallium arsenide, gallium nitride and indium phosphide.

16. The incident angle measurement system of claim 13, wherein the controller rotates the movable workpiece holder to vary a Y angle and wherein an incident angle of the ion beam is determined to be at the Y angle where the output from the detector is a minimum.

17. The incident angle measurement system of claim 13, wherein the single crystal target material is disposed on the movable workpiece holder in place of the workpiece.

18. The incident angle measurement system of claim 17, wherein the single crystal target material has a shape and size of the workpiece.

* * * * *